(12) United States Patent
Morancho-Montagner et al.

(10) Patent No.: US 7,826,287 B2
(45) Date of Patent: Nov. 2, 2010

(54) TESTING NON-VOLATILE MEMORY DEVICES FOR CHARGE LEAKAGE

(75) Inventors: Laurence Morancho-Montagner, Ramonville (FR); Jean-Louis Chaptal, Toulouse (FR); Serge De Bortoli, Castanet Tolosan (FR); Gerard Sarrabayrouse, Mouchan (FR)

(73) Assignee: Freescale Semiconductor, Inc., Austin, TX (US)

(*) Notice: Subject to any disclaimer, the term of this patent is extended or adjusted under 35 U.S.C. 154(b) by 186 days.

(21) Appl. No.: 12/280,480

(22) PCT Filed: Feb. 24, 2006

(86) PCT No.: PCT/EP2006/002854

§ 371 (c)(1),
(2), (4) Date: Aug. 22, 2008

(87) PCT Pub. No.: WO2007/095974

PCT Pub. Date: Aug. 30, 2007

(65) Prior Publication Data

US 2009/0016115 A1     Jan. 15, 2009

(51) Int. Cl.
G11C 29/00    (2006.01)
G11C 7/00     (2006.01)

(52) U.S. Cl. .................. 365/201; 365/200; 365/106; 365/114

(58) Field of Classification Search .................. 365/201, 365/200, 106, 114
See application file for complete search history.

(56) References Cited

U.S. PATENT DOCUMENTS

| | | | |
|---|---|---|---|
| 4,799,021 A * | 1/1989 | Cozzi | 324/73.1 |
| 5,109,257 A * | 4/1992 | Kondo | 365/185.18 |
| 5,265,099 A | 11/1993 | Feinstein et al. | |
| 5,519,334 A | 5/1996 | Dawson | |
| 5,986,461 A | 11/1999 | Kalb et al. | |
| 6,541,987 B1 | 4/2003 | Bruce | |
| 2002/0021141 A1 | 2/2002 | Hartmann | |
| 2003/0001597 A1 | 1/2003 | Juhn et al. | |

OTHER PUBLICATIONS

PCT/EP2006/002854 Search Report and Written Opinion, Aug. 10, 2006.
Brown, "Telecommunications" T&A Constable, Ltd., 1974, Edinburch XP002391993, p. 5, paragraph 1.4-p. 7, line 18; figure 1.3.
Lanzoni, et al. "Evaluation of EEPROM data retention by field acceleration", 1991 Quality and Reliability Engineering Int'l, vol. 7.

(Continued)

*Primary Examiner*—Hoai V Ho
*Assistant Examiner*—Kretelia Graham

(57) ABSTRACT

The method of and apparatus for testing a floating gate non-volatile memory semiconductor device comprising an array of cells including floating gates for storing data in the form of electrical charge. The method includes applying a test pattern of said electrical charge to the floating gates, exposing the device to energy to accelerate leakage of the electrical charges out of the cells, and subsequently comparing the remaining electrical charges in the cells to the test pattern. The energy is applied in the form of electromagnetic radiation of a wavelength such as to excite the charges in the floating gates to an energy level sufficient for accelerating charge loss from the floating gates of defective cells relative to charge loss from non-defective cells. The wavelength is preferably in the range of 440 to 560 nm.

20 Claims, 3 Drawing Sheets

OTHER PUBLICATIONS

JESD22-A117, "EEPROM Program/Erase endurance and data retention", Mar. 2006, 16 pages, JEDEC Solid State Technology Association, USA.

JESD22-A103-B, "High Temperature Storage Life", Aug. 2001, 10 pages, JEDEC Solid State Technology Association, USA.

* cited by examiner

TESTING NON-VOLATILE MEMORY DEVICES FOR CHARGE LEAKAGE

FIELD OF THE INVENTION

This invention relates to non-volatile memory devices of the kind storing data in the form of electrical charge in cells in semiconductor dice. More particularly, the invention relates to testing such devices for charge leakage and to a method of producing devices including such a test.

BACKGROUND OF THE INVENTION

Non-volatile memory ('NVM') devices store data even when external power supplies are disconnected. Various physical properties of materials have been proposed for data retention. The present invention relates to the kind of NVM devices in which electrical charge is retained in cells in a semiconductor device and the presence or absence of charge in a cell defines the assertion and de-assertion of a bit of data in the memory.

A particular kind of NVM device to which the invention is applicable especially, but not exclusively, is a floating gate Metal Oxide Silicon ('MOS') device. Such a device, as shown in FIGS. 1, 2 and 3 of the accompanying drawings comprises a floating gate 12, typically of polycrystalline Silicon, insulated from the substrate by a layer of Silicon Oxide 16 (although other insulating materials can be used) and forming a lateral Field-Effect Transistor ('FET') with source 18 and drain 20 regions under the face of the substrate. When writing in a cell of the memory, charge is stored in the floating gate to assert or de-assert data stored in the cell by applying an electric potential to a control gate electrode 22 connected to control gate region 24 in capacitive coupling with the floating gate 12, source 18, drain 20 and transistor region 26 being grounded and the charge tunnelling through the insulating material between the floating gate 12 on one hand and transistor region 26 on the other hand. Data is read by applying a smaller sense potential to the control gate, insufficient to cause significant amounts of charge to tunnel between the floating gate 12 on one hand and the control gate region 24 or transistor region 26 on the other hand, but such as to accumulate greater or lesser amount of charge in the channel of the transistor according to the charge stored in the floating gate 12. The data is then read by responding to the corresponding current flow between the source 18 and drain 20 of the transistor.

Data is required to be retained for a long period of time in an NVM even in the absence of an external power supply, that is to say for a period of months or years and even up to 10 years or more in some applications. A critical criterion for performance of the NVM device is that the leakage of charge from the cells must be very low, so that charge remains in the cells for the required life. This criterion is to be met by substantially all active cells in the device, even if a small proportion of individual defective cells could be tolerated if data is stored in redundant fashion and error checking algorithms are used.

Manufacturing techniques do not guarantee a sufficiently high proportion of reliable cells. Accordingly it is necessary to test the charge retention of cells in such a device for defective cells. One test technique consists of entering a known data pattern into the device, leaving the device for a period and checking whether each cell has retained the stored data. However performing this test technique at or near to room temperature requires a test time comparable with the order of magnitude of the required storage life, which is months or even years and is clearly incompatible with testing each dice of a commercial production run or even samples from each production run.

Test techniques have been proposed in attempts to accelerate obtaining the results. One such technique consists of heating the products to be tested. However, there are limits to the temperatures that can be used, in particular because heating to too high a temperature has the effect of permanently altering the physical properties of the products being tested. Furthermore heating may alter the detection of defects by annealing the material of the device under test, which may occur above approximately 125° C. with silicon semiconductor dice and this effect limits the usable temperatures. Accordingly, this technique still requires testing over periods of the order of hundreds of hours or even a thousand hours, which is still highly undesirable for testing whole production runs.

Another technique utilises the application of an electrical bias to the products to be tested to accelerate charge loss. However, it is found that the bias voltage is not effective with all cases of cells liable to charge loss, with the consequent risk of defective cells being undetected and the products shipped to customers, with corresponding degradation of production quality. Even combining the technique of heating the tested products with the application of an electrical bias does not solve the problem of quality assurance associated with the electrical bias technique, nor appreciably improve the test time for the heating technique.

Various techniques have been proposed in attempts to test other defects of semiconductor products. For example, U.S. Pat. No. 5,519,334 discloses a method of characterising charge traps in oxides using a light source. U.S. Pat. No. 6,541,987 discloses a method of laser excited detection of defective semiconductor devices. Other descriptions of test techniques appear in JEDEC standards: JESD22-A103-B August 2001"High temperature storage life" and JESD22-A117 "EEPROM Program/Erase endurance and data retention" and in the article "Evaluation of EEPROM data retention by field acceleration", M. Lanzoni, C. Riva, P. Olivo and B. Riccó, Quality and Reliability Engineering International vo 7, 1991.

There remains a need for a reliable and rapid test for electrical charge leakage in cells in semiconductor NVM devices.

SUMMARY OF THE INVENTION

The present invention provides a method of testing a non-volatile memory semiconductor device, a method of producing non-volatile memory semiconductor device including such a testing step, and apparatus for testing a non-volatile memory semiconductor device as described in the accompanying claims.

DETAILED DESCRIPTION OF THE PREFERRED EMBODIMENTS

Figure 1:
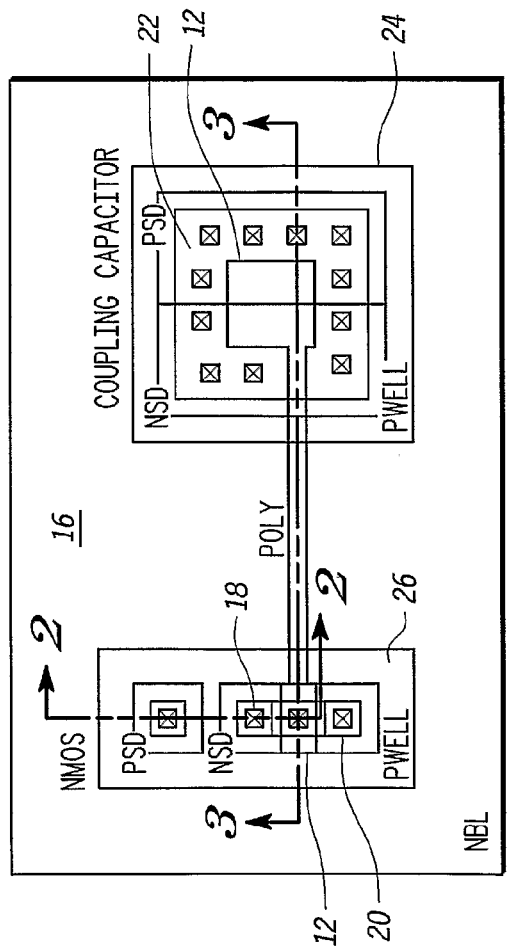
FIG. 1 is a schematic view in plan of a non-volatile memory device suitable for testing in accordance with one embodiment of the invention, given by way of example.
Figure 3:
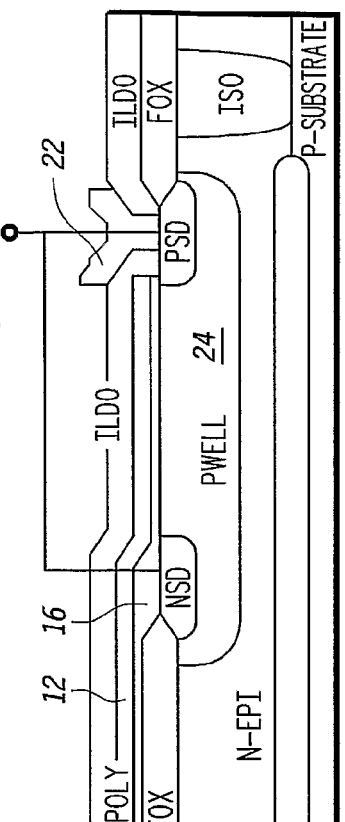
FIG. 3 is a schematic sectional view of the NVM device of FIG. 1 along the lines B-B of FIG. 1.
Figure 2:
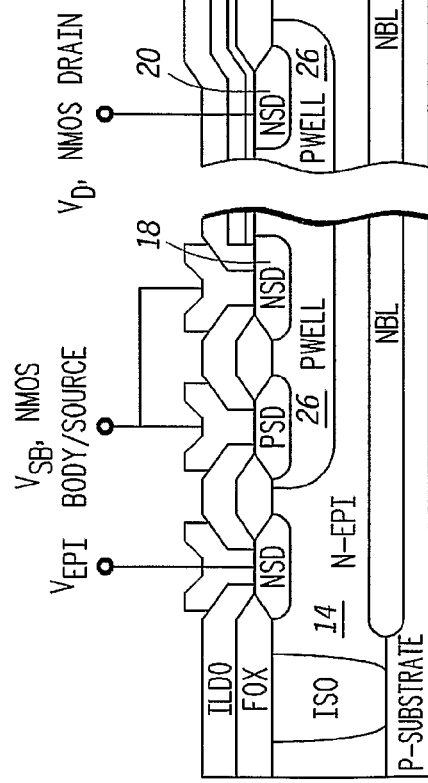
FIG. 2 is a schematic sectional view of the NVM device of FIG. 1 along the lines A-A of FIG. 1.

Referring first to FIGS. 1 to 3, the non-volatile memory ('NVM') device shown to which this embodiment of a method of test is applicable is a floating gate Metal Oxide Silicon ('MOS') non-volatile memory device, although it will be appreciated that the invention can be applied to other materials. The device comprises an array of memory cells 10, of which one is shown in the drawing, each comprising a floating gate 12, of polycrystalline Silicon, insulated from the Silicon substrate 14 by a layer 16 of Silicon Oxide (although other insulating materials can be used). Source and drain regions 18 and 20 under the face of the substrate 14 form with the floating gate 12 a lateral Field-Effect Transistor ('FET'). The insulating layer 16 is of reduced thickness between the floating gate 12 and the face of the substrate 14 in the transistor region 26, so that a channel of opposite conductivity type to the substrate may be formed under the face between the source and drain regions 18 and 20 by carriers attracted by the electrical potential due to charge in the floating gate 12.

A control gate electrode 22 is provided at a position spaced from the source and drain regions 18 and 20 and connects with a control gate region 24 underlying the floating gate 12. The control gate region 24 is in capacitive coupling with the floating gate 12. The substrate is formed by suitable manufacturing processes, for example including growing a layer on a Silicon body by epitaxial growth, diffusing dopants into the Silicon and etching regions at the surface of the substrate. It will be appreciated that while the present embodiments of a method of and apparatus for testing NVM devices are applicable to an NVM device of the kind shown, they are also applicable to other NVM devices.

In operation of such a device, when writing in the cell 10, charge is stored in the floating gate 12 to assert or de-assert data stored in the cell 10 by applying an electric potential to the control gate electrode 22 and region 24 in capacitive coupling with the floating gate, the potential being sufficient to cause the charge to tunnel through the insulating material 16 between the control gate region 24 on one hand and floating gate 12 on the other hand, source 18, drain 20 of transistor region 26 being grounded. Data is read by applying a smaller sense potential to the control gate, insufficient to cause significant amounts of charge to tunnel between the floating gate 12 on one hand and transistor region 26 and control gate region 24 on the other hand, but such as to accumulate greater or lesser charge in the channel of the transistor 26 according to the amount of charge stored in the floating gate 12. The data is then read by responding to the corresponding current flow between the source and drain 18 and 20 of the transistor, by applying a potential difference between source and drain.

Figure 4:
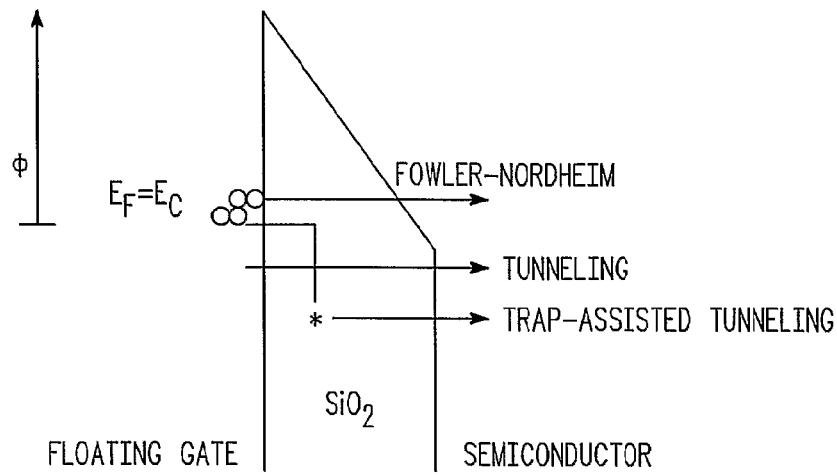
FIG. 4 is a schematic diagram illustrating some possible mechanisms of charge leakage from the non-volatile memory device of FIG. 1.

In a perfect memory, having no defects in the insulating material, especially between the floating gate 12 and the Silicon substrate nor between the floating gate 12 and the control gate region 24, the mechanism of leakage of charge, that is to say conduction, away from the floating gate 12 is of the intrinsic type. The carriers transit through the insulating material by tunnel effect, directly at low electric fields and by Fowler-Nordheim effect at higher fields. In the type of cell illustrated in FIGS. 1 to 3, the voltage across the insulating layer will be of the order of 5 volts for a charge of $10^{-13}$ C and the Fowler-Nordheim effect will predominate. The accumulation of charge in the floating gate 12 increases the electric field in the underlying insulating layer thus increasing current conduction through the energy barrier Φ of the insulator as shown in FIG. 4, in which the vertical axis represents energy levels and the horizontal axis represents position in the thickness of the device.

Faults in the insulating layer give rise to extrinsic mechanisms of charge leakage. Among other such defects are charge traps, which may increase the probability of leakage by the intrinsic mechanism or generate extrinsic mechanisms such as trap-assisted tunneling.

Heating would energise the charges and increase the chances of the energy of the charge exceeding the barrier ( ) for a given mechanism of tunnelling, accelerating the loss of charge from the floating gate 12. This is the phenomenon utilised by the standard heating test referred to above. Acceleration of the charge leakage by application of high electric field would also increase the chances of the charge tunnelling through the insulator but would mask and neglect certain types of defect.

Figure 5:
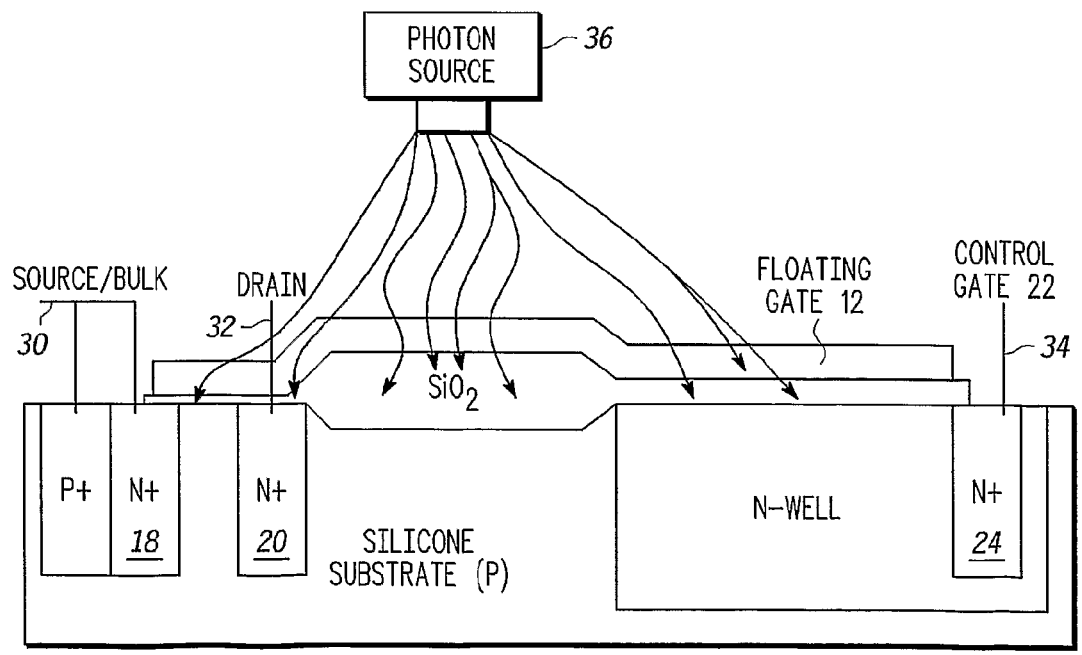
FIG. 5 is a schematic view partly in section of a non-volatile memory device being tested in an apparatus in accordance with one embodiment of the invention, given by way of example.
Figure 6:
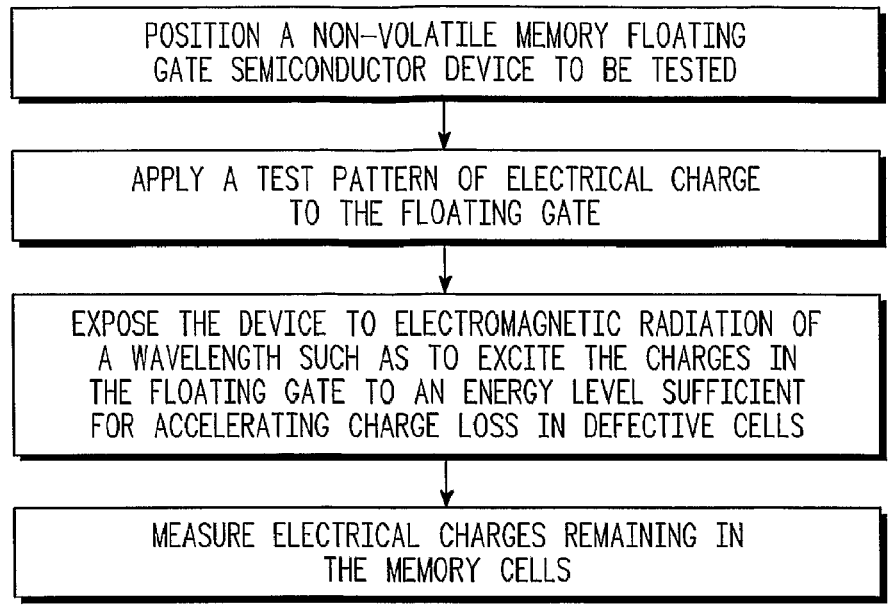
FIG. 6 is a flow chart of a method of testing a non-volatile memory device in accordance with one embodiment of the invention, given by way of example.

In accordance with an embodiment of the invention, the NVM device is tested systematically after production in an apparatus of which one example is shown in FIG. 5. The apparatus includes probes 30, 32 and 34 for applying electrical potentials to the source and drain electrodes 18 and 20 and to the control gate electrode 22 and region 24. A processor (not shown) is arranged to apply a test pattern of electrical charges to the floating gates 12 and to compare it to the pattern of charges remaining on the floating gates 12 of the cells 10 after exposure to the radiation, so that any substantial change in the charges remaining on the floating gate 12 of a cell 10 is indicative of defects, as in known test methods.

In this embodiment of the invention, the test apparatus also includes a source of electromagnetic radiation 36, which is chosen so that a photon impacting a charge carrier will energise the carrier and accelerate substantially its chances of leaking from a defective cell. The radiation can flood the surface of a wafer including many of the devices to be tested. However in this embodiment of the present invention, the radiation is more focussed and is scanned to cover the surface of the wafer progressively. In manufacturing production of the devices, the test is then carried out on the wafer before separation of the devices from the wafer, in the probe test station. However it is also possible to test individual devices.

The positions of carriers in the floating gate 12 most likely to give rise to charge leakage are situated close to the interface between the floating gate 12 and the insulating layer 16. Accordingly, the wavelength of the radiation and the direction of its propagation are chosen to ensure that the radiation penetrates to these positions. In this embodiment of the invention, the radiation illuminates the surface of the cell 10 and passes through the Polysilicon of the floating gate 12. The test has been performed using a variety of wavelengths of radiation in the visible range. The Polysilicon is typically highly doped, for example with Boron or Phosphorus. It has been found that in testing a device with this type of Polysilicon, radiation of wavelength in the range of 440 to 560 nm is capable of penetrating the upper layers sufficiently, although radiation of other wavelengths can be used. In particular radiation of wavelength in the range of 480 to 520 nm has been found especially effective. The above wavelengths have been found effective to excite the charges and accelerate charge loss of defective cells substantially more than charge loss from non-defective cells, whose charge loss during the test time remains negligeable.

The power density of incident radiation was chosen so as to avoid excessive heating of the device being tested and densities between 5 and 30 mW/cm$^2$ were found especially effective, although greater or smaller power densities are also effective. In particular, the density of photons at such power levels gave a very substantial acceleration of the extrinsic leakage mechanisms involved, the chances of a photon intercepting a charge carrier being sufficient even after attenuation of the radiation by the upper layers through which it transits.

Figure 7:
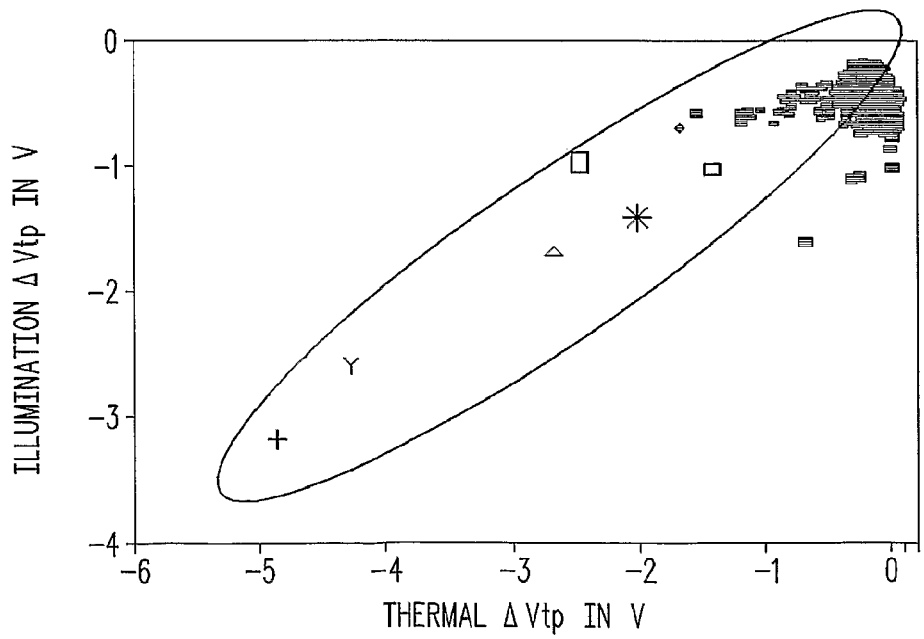
FIG. 7 is a graph showing the variations in potential of different cells during the test of FIG. 6, compared with their variations in potential during a test in accordance with a previously known method (thermal acceleration).

FIG. 7 illustrates a comparison of the test results using a standard heating test (the horizontal axis) and the test of this embodiment of the present invention (the vertical axis). It has been found that the distribution of charge loss from defective cells, measured by the drop in voltage at the floating gate 12 during the course of the tests is extremely similar and the same defective cells were detected by both tests (standard heating test and the radiation test of this embodiment of the present invention). However, the heating test, carried out at 300° C., which cannot be exceeded without a risk of damaging the device tested, took 100 hours, whereas the radiation test of this embodiment of the present invention at wavelength 514.5 nm took 20 mins and the same radiation test at wavelength 488 nm took only 5 mins. Optimisation of the parameters of the radiation test of this embodiment of the present invention is expected to be possible and to improve further the performance of the radiation test.

It will be noted that the design of the NVM device itself will influence the reliability of the test of the present invention and optimisation of the test parameters will take account of specific aspects, such as the positioning of metal conductors or other layers that could strongly absorb or reflect the test radiation. It is desirable for such layers to avoid the regions above the floating gate 12 in the transistor region 26 and control gate region 24.

The invention claimed is:

1. A method of testing a floating gate non-volatile memory semiconductor device including an array of cells including floating gates for storing data in the form of electrical charge and insulating material for insulating said floating gates, the method comprising:
    applying a test pattern of said electrical charge to the floating gates;
    exposing the device to energy to accelerate leakage of the electrical charges out of the cells; and
    subsequently comparing the remaining electrical charges in the cells to the test pattern, wherein said energy comprises electromagnetic radiation of a wavelength such as to excite the charges in the floating gates to an energy level sufficient for accelerating charge loss through said insulating material by a tunnel-effect mechanism from the floating gates of defective cells relative to charge loss from non-defective cells.

2. The method of testing a non-volatile memory semiconductor device as claimed in claim 1, wherein said radiation penetrates through said floating gate to excite said charges to said energy level sufficient for accelerating charge loss from defective cells by said tunnel-effect mechanism.

3. The method of testing a non-volatile memory semiconductor device as claimed in claim 1, wherein said floating gates comprise Silicon.

4. The method of testing a non-volatile memory semiconductor device as claimed in claim 3, wherein said floating gates comprise Polysilicon.

5. The method of testing a non-volatile memory semiconductor device as claimed in claim 1, wherein the wavelength of said radiation is in the visible range.

6. The method of testing a non-volatile memory semiconductor device as claimed in claim 4, wherein the wavelength of said radiation is in the range of 440 to 560 nm.

7. The method of testing a non-volatile memory semiconductor device as claimed in claim 6, wherein the wavelength of said radiation is in the range of 480 to 520 nm.

8. The method of testing a non-volatile memory semiconductor device as claimed in claim 1, wherein each of said cells comprises:
    a lateral transistor having source and drain regions at a face of a semiconductive substrate;
    said floating gate at being juxtaposed with the transistor;
    said insulating material comprising:
        a layer at the face of the substrate insulating the floating gate from the transistor;
        a control gate being in capacitive coupling with the floating gate;
        said radiation passing through said floating gate to access the parts of said devices to be tested adjacent said face.

9. A method of producing a wafer comprising an array of non-volatile memory floating gate semiconductor devices, including a testing step of testing the devices by the method as claimed in claim 1.

10. A method of producing non-volatile memory semiconductor dice, including a testing step of testing by the method as claimed in claim 1.

11. An apparatus for testing a floating gate non-volatile memory semiconductor device including an array of cells including floating gates for storing data in the form of electrical charge and insulating material for insulating said floating gates, the apparatus comprising:
    probe means for applying a test pattern of said electrical charge to the floating gates and for subsequently detecting the remaining electrical charges in the cells for comparison with the test pattern; exposure means for exposing the device to energy to accelerate leakage of the applied electrical charges out of the cells before comparison with the test pattern, said energy to which said exposure means is arranged to expose the device comprising electromagnetic radiation of a wavelength such as to excite the charges in the floating gates to an energy level sufficient for accelerating charge loss through said insulating material by a tunnel-effect mechanism from the floating gates of defective cells relative to charge loss from non-defective cells.

12. The apparatus for testing a non-volatile memory semiconductor device as claimed in claim 11, wherein the wavelength of said radiation is in the visible range.

13. The apparatus for testing a non-volatile memory semiconductor device as claimed in claim 12, wherein the wavelength of said radiation is in the range of 440 to 560 nm.

14. The apparatus for testing a non-volatile memory semiconductor device as claimed in claim 13, wherein the wavelength of said radiation is in the range of 480 to 520 nm.

15. The method of testing a non-volatile memory semiconductor device as claimed in claim 2, wherein said floating gates comprise Silicon.

16. The method of testing a non-volatile memory semiconductor device as claimed in claim 3, wherein the wavelength of said radiation is in the visible range.

17. The method of testing a non-volatile memory semiconductor device as claimed in claim 4, wherein the wavelength of said radiation is in the visible range.

18. The method of testing a non-volatile memory semiconductor device as claimed in claim 2, wherein the wavelength of said radiation is in the visible range.

19. The method of testing a non-volatile memory semiconductor device as claimed in claim 2, wherein each of said cells comprises:

a lateral transistor having source and drain regions at a face of a semiconductive substrate;

said floating gate being juxtaposed with the transistor;

said insulating material comprising:

a layer at the face of the substrate insulating the floating gate from the transistor;

a control gate being in capacitive coupling with the floating gate;

said radiation passing through said floating gate to access the parts of said devices to be tested adjacent said face.

20. The method of testing a non-volatile memory semiconductor device as claimed in claim 3, wherein each of said cells comprises:

a lateral transistor having source and drain regions at a face of a semiconductive substrate;

said floating gate being juxtaposed with the transistor;

said insulating material comprising:

a layer at the face of the substrate insulating the floating gate from the transistor;

a control gate being in capacitive coupling with the floating gate;

said radiation passing through said floating gate to access the parts of said devices to be tested adjacent said face.

\* \* \* \* \*